United States Patent
Chen et al.

(10) Patent No.: US 9,874,601 B2
(45) Date of Patent: Jan. 23, 2018

(54) INTEGRATED TIME DEPENDENT DIELECTRIC BREAKDOWN RELIABILITY TESTING

(71) Applicant: INTERNATIONAL BUSINESS MACHINES CORPORATION, Armonk, NY (US)

(72) Inventors: Jifeng Chen, Willimantic, CT (US); Dirk Pfeiffer, Croton on Hudson, NY (US); Thomas M. Shaw, Peekskill, NY (US); Peilin Song, Lagrangeville, NY (US); Franco Stellari, Waldwick, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/258,535

(22) Filed: Sep. 7, 2016

(65) Prior Publication Data

US 2017/0010322 A1 Jan. 12, 2017

Related U.S. Application Data

(63) Continuation of application No. 13/544,080, filed on Jul. 9, 2012, now Pat. No. 9,448,277, which is a continuation of application No. 13/530,782, filed on Jun. 22, 2012, now Pat. No. 9,557,369.

(51) Int. Cl.
*G01R 31/28* (2006.01)
*G01R 31/311* (2006.01)

(52) U.S. Cl.
CPC ..... *G01R 31/2855* (2013.01); *G01R 31/2858* (2013.01); *G01R 31/2879* (2013.01); *G01R 31/311* (2013.01); *G01R 31/281* (2013.01); *G01R 31/2817* (2013.01)

(58) Field of Classification Search
USPC ............................................ 702/59; 324/523
See application file for complete search history.

(56) References Cited

U.S. PATENT DOCUMENTS

| | | |
|---|---|---|
| 4,680,635 A | 7/1987 | Khurana |
| 4,755,874 A | 7/1988 | Esrig et al. |
| 4,811,090 A | 3/1989 | Khurana |

(Continued)

FOREIGN PATENT DOCUMENTS

| | | |
|---|---|---|
| EP | 0559313 A1 | 9/1993 |
| JP | 1072540 A | 3/1989 |

(Continued)

*Primary Examiner* — Gregory J Toatley
*Assistant Examiner* — Terence Stifter, Jr.
(74) *Attorney, Agent, or Firm* — Tutunjian & Bitetto, P.C.; Daniel P. Morris

(57) ABSTRACT

Systems for reliability testing include a picometer configured to measure a leakage current across a device under test (DUT); a camera configured to measure optical emissions from the DUT based on a timing of the measurement of the leakage current; and a test system configured to apply a stress voltage to the DUT and to correlate the leakage current with the optical emissions using a processor to determine a time and location of a defect occurrence within the DUT by locating instances of increased noise in the leakage current that correspond in time with instances of increased optical emissions.

19 Claims, 5 Drawing Sheets

(56) References Cited

U.S. PATENT DOCUMENTS

| | | | |
|---|---|---|---|
| 5,783,835 A | 7/1998 | Hollman et al. | |
| 6,788,093 B2 | 9/2004 | Aitren et al. | |
| 8,115,170 B2 | 2/2012 | Stellari et al. | |
| 2004/0027149 A1* | 2/2004 | Aitren | G01R 31/311 324/762.05 |
| 2006/0232284 A1* | 10/2006 | Condon | G01R 31/302 324/750.3 |
| 2010/0329586 A1* | 12/2010 | Stellari | H04N 5/2259 382/284 |
| 2012/0229145 A1* | 9/2012 | Kerber | G01R 31/129 324/537 |

FOREIGN PATENT DOCUMENTS

| | | |
|---|---|---|
| JP | 2003133382 A | 5/2003 |
| WO | WO02/07169 A1 | 1/2002 |

\* cited by examiner t = 5 hrs    t = 5.7 hrs

INTEGRATED TIME DEPENDENT DIELECTRIC BREAKDOWN RELIABILITY TESTING

GOVERNMENT RIGHTS

This invention was made with Government support under Contract No.: N66001-11-C-4104 (awarded by Defense Advanced Research Projects Agency (DARPA)). The government has certain rights in this invention.

BACKGROUND

Technical Field

The present invention relates to reliability testing and, more particularly, to isolating and localizing time dependent dielectric breakdown defects.

Description of the Related Art

Time dependent dielectric breakdown (TDDB) in the back-end-of-line (BEOL) in integrated circuits is a significant source of reliability problems as circuit formation technology reaches 22 nm and beyond. As a result, the performance of interconnection is susceptible to technology shrinking, new material (low-k value) features, and process improvement and development. To better understand the effect, leakage current measurement and emission microscopy tests have been conducted separately. Leakage current measurement demonstrates the evolution of dielectric breakdown times. Extrapolation and interpolation on the measurement results then enable the lifetime analysis of the dielectric and the TDDB effect. Light emission tests have also been used, since photon emission is recognized as occurring via energy states generated by dangling bonds and/or impurities at the material interface, which is tightly related to the TDDB progressive development. However, the detailed mechanism of the TDDB effect is still not clear, for that: (1) the progressive development of TDDB effect is not carefully caught on-site; and (2) all prior analysis was conducted off-line and after the experiments, when the TDDB sites on the device under test (DUT) are totally destroyed. This leads to inaccuracy and insufficient for the further failure analysis, including physical failure analysis and scanning electron microscope; and (3) the correlation between electrical leakage current and photon emission is not studied.

SUMMARY

A system for reliability testing includes an electrical measurement device configured to measure an electrical characteristic of a DUT; a camera configured to measure an optical characteristic of the DUT based on the timing of the measurement of the electrical characteristic; and a test system configured to apply a stress to the DUT and to correlate measurements of the electrical characteristic with measurements of the optical characteristic using a processor to determine a time and location of a defect occurrence within the DUT.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The present principles provide reliability testing that combines both the electrical and emission characteristics of a device under test. Electrical monitoring of the DUT is performed during various types of stress in order to detect TDDB. The present principles provide integration and synchronization of electrical measurements and emission microscopy with an online instantaneous data analysis and further offline data analysis and processing. This provides early detection of TDDB events and also allows precise spatial localization before any real destructive event takes place, so that physical failure analysis can be performed to investigate precursors and root causes that lead to the TDDB event. This is contrasted to previous techniques, whereby emission testing was only performed post-measurement in a failure analysis mode to aid in the localization of the destroyed region of the DUT.

Figure 1:
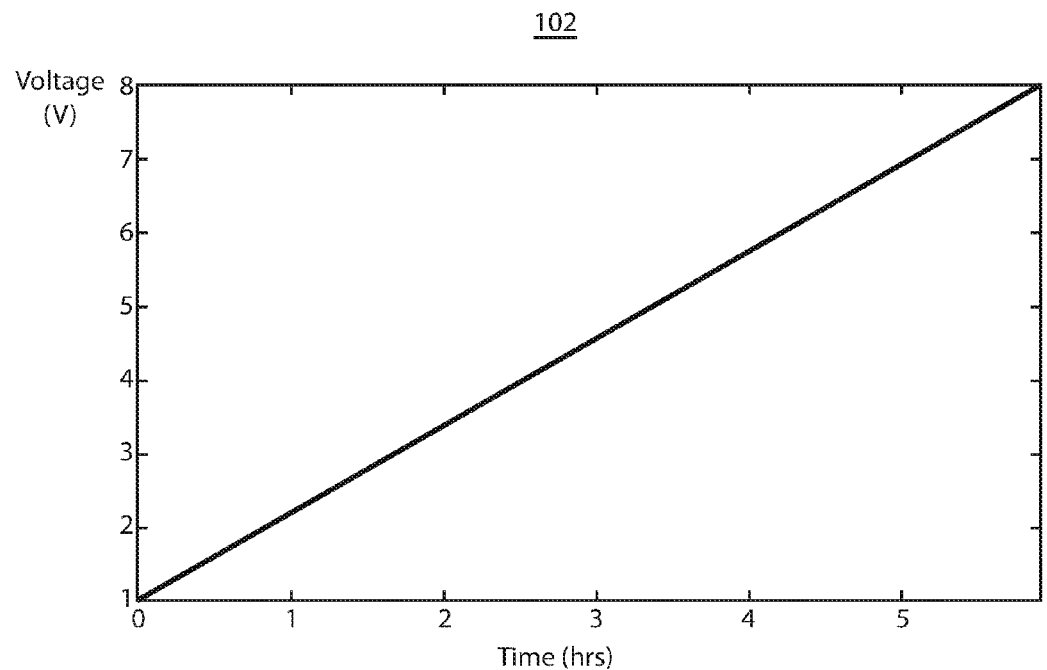
FIG. 1 is a pair of graphs that show electrical measurements of a circuit undergoing a time-dependent dielectric breakdown (TDDB)
Figure 1:
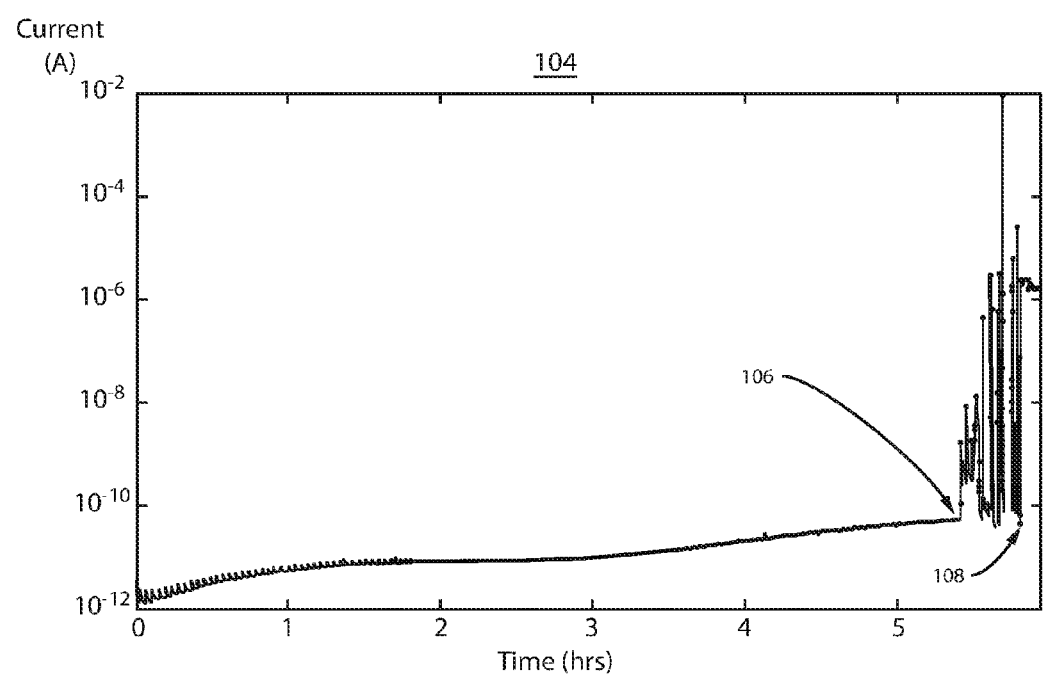

Referring now to FIG. 1, two graphs are shown that show electrical measurements of a circuit undergoing a TDDB event. Graph 102 has a vertical axis of voltage, measured in volts, and a horizontal time axis measured in hours. The graph 102 shows a linear voltage increase with respect to time. Graph 104 has a similar horizontal time axis, but measures leakage current on its vertical axis in amperes. At time 106, abnormal leakage current fluctuations begin in the DUT. These fluctuations represent an in-progress TDDB event. Eventually, at time 108, the DUT has been destroyed by TDDB effects, producing a stable, but much higher, leakage current. The characteristic breakdown pattern shown in graph 104 will not precisely reflect every type of technology, but a similar pattern may be generated for any type of TDDB breakdown event. Noisy behavior, such as that shown in graph 104 after point 106, is frequently a signature of TDDB events.

It should be noted that the TDDB event may occur at any point on the DUT, such that it is impossible to know from the electrical measurements alone precisely where the breakdown happened. There is no external visual indication to show the breakdown after it has occurred.

Figure 2:
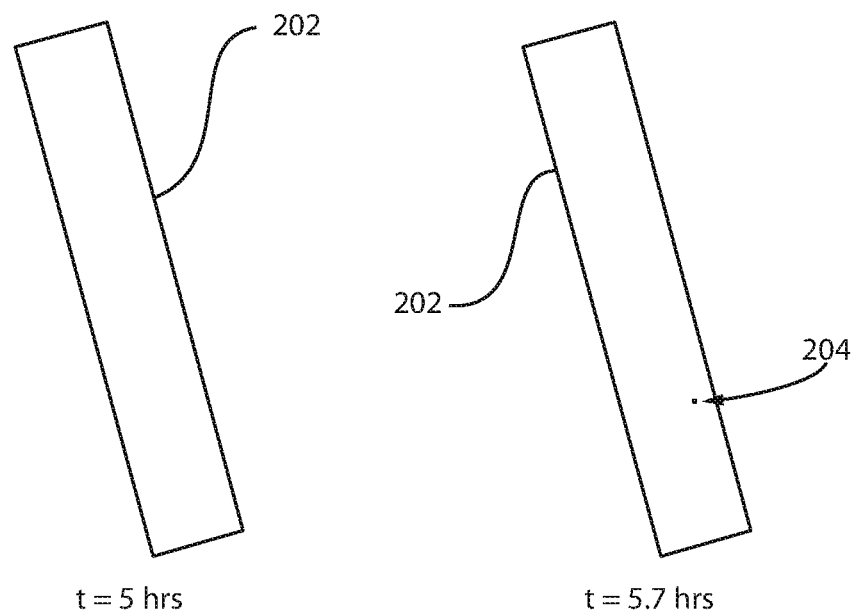
FIG. 2 is a diagram of an exemplary device under test comparing an image before a TDDB event and an image during the TDDB event.

Referring now to FIG. 2, an exemplary DUT 202 is shown at two different points in time. The representation of the DUT 202 is a top-down picture, taken over a period of time to allow accumulation of emission light. At t=5 hours, no emissions are visible at the DUT 202. However, during the TDDB effect, at t=5.7 hours, a point of light 204 is recorded by the camera indicating the physical location of the breakdown in the DUT 202.

There are many effects which can cause point emissions such as that shown as 204. As such, merely providing visual measurements of a DUT 202 does not suffice to determine which points represent TDDB events. However, by integrating electrical measurements and optical measurements, the characteristic breakdown pattern shown in graph 104 can be used to provide timing information for a camera, such that optical emissions 204 can be correlated with known TDDB events.

Figure 3:
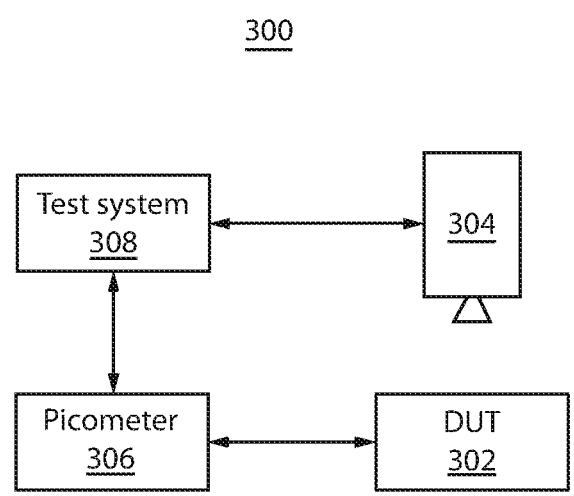
FIG. 3 is a diagram of a system for performing TDDB reliability tests according to the present principles.

Referring now to FIG. 3, a system 300 for performing TDDB reliability tests is shown. A DUT 302 is optically monitored using an appropriate imaging camera 304. This camera may be any suitable emission microscopy system with a sufficiently high accuracy and resolution to detect the emissions produced by a TDDB event. Any camera 304 will have a determined exposure time needed to detect an emission event. In one embodiment, the camera 304 may detect emissions in near-infra red wavelengths, but it is also contemplated that other tools such as a superconducting quantum interference device (SQUID), thermal cameras, and laser stimulation tools may be employed to localize TDDB sites.

Exposure time for the camera 304 represents a period of integration that determines the time resolution of optical imaging. A camera 304 which integrates over the entire duration of a test will record every emission event, but will not be able to distinguish said events in time. As such, it is advantageous to limit the integration period to a minimal length of time that enables detection. Alternatively, the camera 304 may be used in a "movie" mode, which may capture faster changing events if said events are relatively bright. In each case, a high spatial resolution of images permits a concurrent precise spatial localization of any detected emission to guide subsequent physical failure analyses.

An electrical measurement device 306 monitors electrical properties of the DUT 302 at a known frequency. It is specifically contemplated that the electrical measurement device 306 may be a picometer measuring leakage currents, but this is not intended to be limiting. Any appropriate measurement device may be used to detect characteristic TDDB patterns. The camera 304 and the measurement device 306 provide measurement information to the test system 308. The test system 308 coordinates measurements from the measurement device 306 with imaging periods in the camera 304. After every electrical measurement, the test system 308 initiates a new emission test if the camera is idle. The correlation between specific measurements and particular emission tests is stored in a memory in the test system 308 for analysis.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks. The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 4:
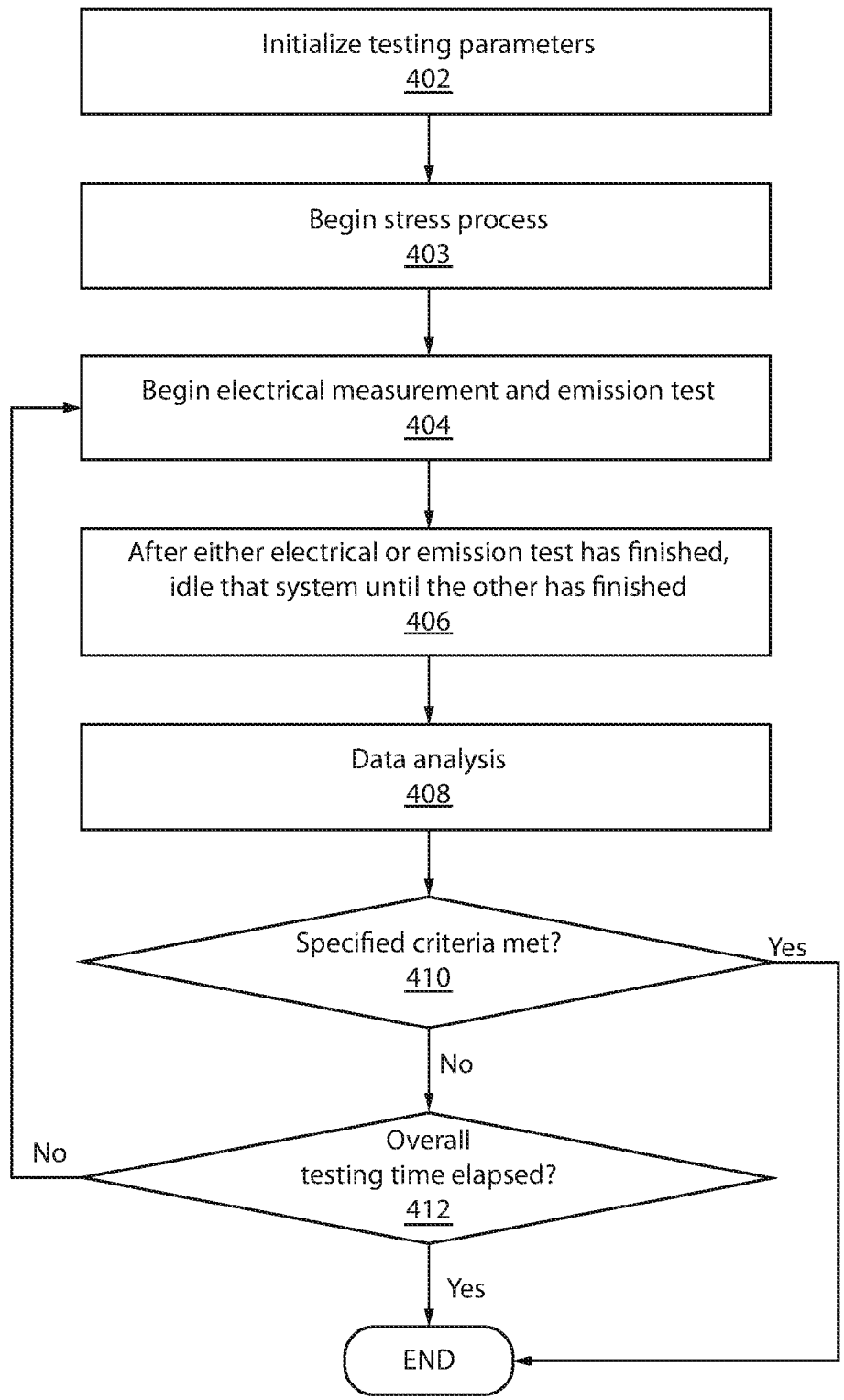
FIG. 4 is a block/flow diagram of a method for integrated electrical and optical testing according to the present principles.

Referring now to FIG. 4, a block/flow diagram of a method for integrated electrical and emission testing is shown. Block 402 begins by initializing test parameters. These parameters may include, for example, stress voltage, stress duration, an overall testing time, a camera mode, a camera integration period, an electrical measurement frequency, and early-termination criteria. These parameters may be entered manually at test system 308 or loaded from predetermined configuration files. Reading in a configuration file offers greater flexibility in controlling measurements, allowing one to create highly robust measurement schemes. For example, stress voltage may be specified according to a designated waveform.

Block 403 begins stressing the DUT 302 by applying, e.g., a stress voltage. As noted above, the particular voltage pattern and duration may be set as user parameters, but it is particularly contemplated that the stress voltage may be a linearly increasing function of time. Optionally, the stress test may run for a predetermined period of time, because TDDB events frequently take time before a breakdown occurs. Thus, to save on storage space, it may be advantageous to delay collection of emission data until TDDB events can be more reasonably expected.

Block 404 then begins electrical measurement and optical emission testing. As noted above, electrical testing may include periodically making electrical measurements of the leakage current across the DUT 302 using, e.g., a picometer 306. After each electrical measurement, block 404 checks the status of camera 304: if the camera is idle, a new emission test is invoked, but if the camera is busy, block 406 idles until the emission test is finished.

After the emission test completes, block 408 performs analysis on the collected data. In the case of a camera 304 in single image mode, emission information is integrated over a specified duration of time to produce a final image. Data analysis may include, e.g., digital 1-dimensional and 2-dimensional filters, derivatives, 2-dimensional gradients, and correlation functions to detect early signs of a TDDB event. These early signs may include increases in leakage current and the appearance of emission spots. A time stamp is associated with each electrical measurement, and each emission measurement may include a start/stop time. Additional associated information that may be stored with a given measurement includes a time difference from a first measurement and a present stress voltage value.

These analytical operations accomplish several goals. Signatures of early TDDB initiation may be used to adaptively change the emission component of the experiment, such as changing parameters that may include acquisition time, acquisition rate, and single-image vs. movie mode. They may also be used to start or stop acquisition. Signatures in both the optical and electrical realms (or a combination of the two) could be used for early detection of the formation of a TDDB event to modify the stress experiment parameters, for example slowing down the process to highlight particular physical phenomena, or even to stop the stress process before the DUT is destroyed, so that physical failure analysis can identify the precursors of TDDB. Analysis can be used to spatially localize the position of the TDDB defect, before or after a destructive event takes place, for later physical failure analysis. Furthermore, by studying the progression of the TDDB effect from its early formation through the destruction of the structure and beyond, a TDDB event in one spatial location may be observed as being followed by other TDDB events at different locations. The region close to a previously damaged location may be susceptible to additional TDDB events.

If data analysis concludes that some specified termination criterion has been met at block 410, e.g., if a TDDB event has been detected, processing halts. If not, and if an overall testing time has not yet elapsed at block 412, processing returns to block 404 and a new set of electrical and emission tests begins. If the overall testing time has elapsed, processing ends.

The data analysis of block 408 includes establishing correlations between electrical measurements and optical emission data. Historical values of electrical measurements may be formatted into an electrical measurement vector. When measuring, for example, leakage current, a leakage current vector is formed at each measurement time instant m that includes all past measurements: $I=[I_1, I_2, I_3, \ldots, I_m]$. Meanwhile, historical values of optical measurements are also formatted into an optical measurement vector: $E=[E_1, E_2, E_3, \ldots, E_n]$. The length of the I and E vectors are usually different, with length(I)≠length(E), so a convolution is used to determine the correlation between them. The correlation between the two vectors is calculated as $$Con_k = conv(I, E) = \sum_j E(j)I(k+1-j),$$

where k=1, . . . , m+n−1 and where the maximum value is regarded as the maximum correlation between the electrical and optical measurements: $Corr=\max(Con_k)$. This is only one possible way to correlate the two vectors. Any appropriate correlation may be used to, e.g., find the best time to stop testing to capture the TDDB event.

In the above evaluation of the correlation between electrical and optical measurements, the maximum emission intensity in the chip area is used to compose the emission vector. While this value may be quickly calculated, it is not able to differentiate between locations. For more accuracy, the chip area can be divided into sub-areas or divided into pixels. Then, multiple emission vectors, each representing a different area in the chip image, may be used to correlate with the single electrical measurement vector. The sub-area having the highest emission value is used as the maximum emission intensity.

Figure 5:
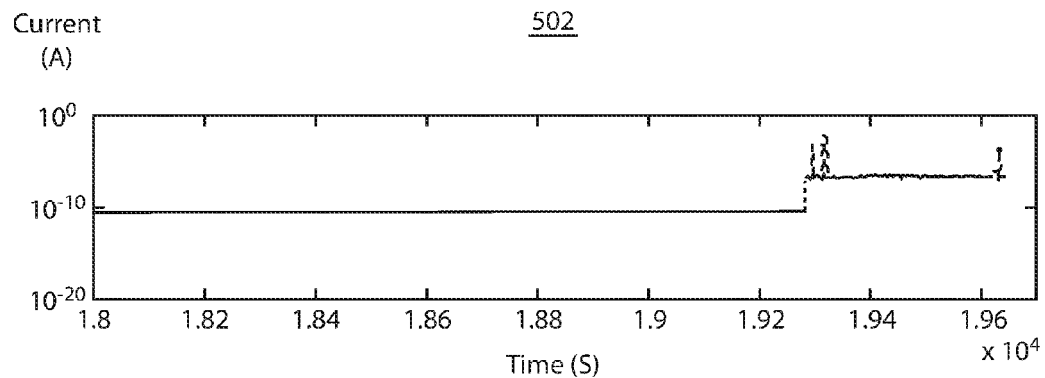
FIG. 5 is a set of graphs showing a correlation between electrical and optical measurements according to the present principles.
Figure 5:
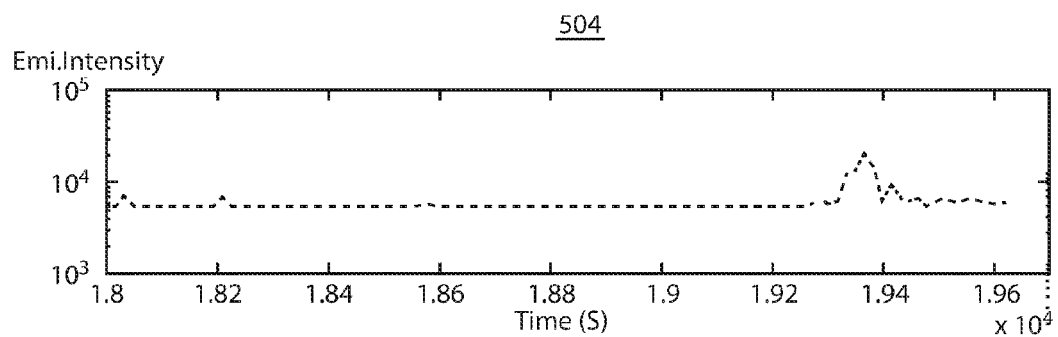
Figure 5:
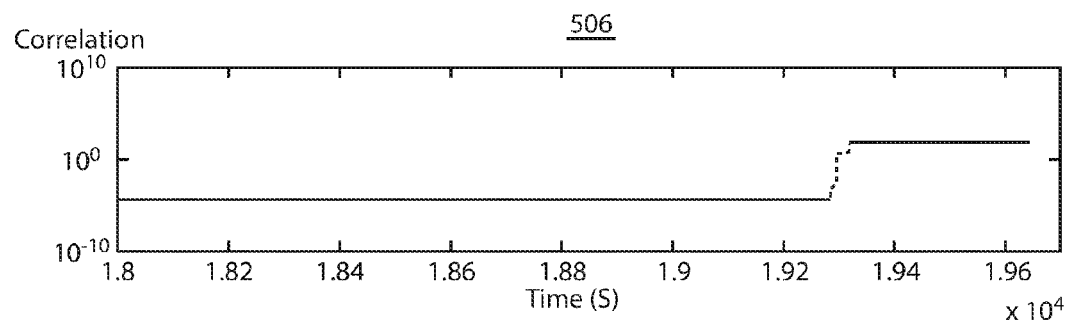

Referring now to FIG. 5, graphs showing measurements of leakage current 502, emission intensity 504, and the calculated correlation 502 between the two is shown. As can be seen from graph 504, emission events are detected which are clearly unrelated to the TDDB event shown in graph 502. The increase in leakage current shown in graph 502 corresponds with a specific emission event in graph 504, producing a corresponding jump in the calculated correlation shown in graph 506.

Figure 6:
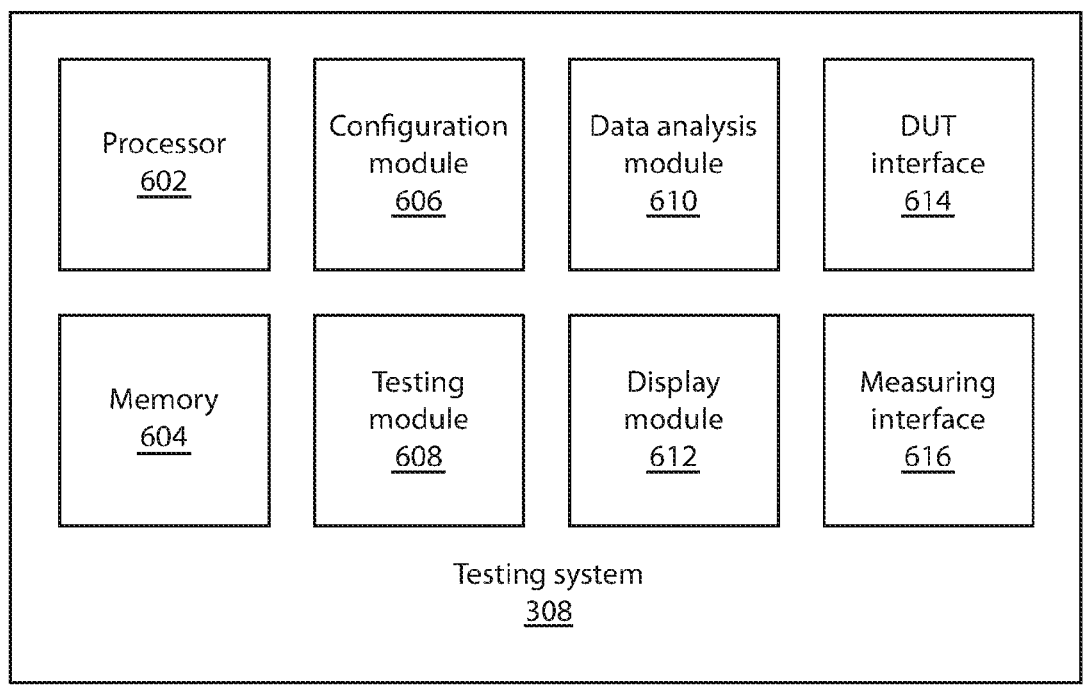
FIG. 6 is a test system to control and analyze TDDB testing according to the present principles.

Referring now to FIG. 6, a more detailed view of testing system 308 is shown. It should first be noted that, although testing system 308 is shown as one unit, its functions may be divided into multiple different devices. This may be advantageous in circumstances where, for example, data analysis might slow the acquisition of data from tests. By implementing such functions on separate hardware, testing efficiency can be increased.

Testing system 308 includes a processor 602 to perform processing related to data analysis and test control, as well as a memory 604 to store measurement and configuration information. The processor 602 and memory 604 are controlled by functional modules which, as described above, may be implemented as hardware, software, or a combination of the two. A configuration module 606 loads in testing parameters, whether inputted manually or by reading a configuration file from memory 604. Said parameters may include, e.g., stress voltage, stress duration, an overall testing time, a camera mode, a camera integration period, an electrical measurement frequency, and early-termination criteria.

A testing module 608 initiates and controls electrical and emission testing by controlling, e.g., electrical measuring device 306 and camera 304. The testing module 608 monitors the status of the measuring device 306 and the camera 304 to determine when said devices are active or idle and coordinates the activation of the respective testing cycles. The testing module 608 further collects data from each respective device and stores said data in memory 604.

A data analysis module 610 accesses data stored in memory 604 and uses processor 602 to analyze the measurements as set forth above. In particular, the data analysis module 610 attempts to correlate electrical and optical measurements to predict and localize TDDB events. The data analysis module 610 may furthermore communicate with configuration module 606 and testing module 608 to provide realtime changes to parameters and testing procedure in response to detected conditions. For example, in one case the data analysis module 610 may halt testing upon detection of the early stages of a TDDB event, such that later physical failure analysis may locate precursors to TDDB failures. A display module 612 displays real-time or offline results and analysis, allowing human operator to further control the testing procedure.

The testing system 308 furthermore has a DUT interface 614, which allows testing module 608 to provide, e.g., stress voltage to the DUT, and a measuring interface 616 that allows the testing module 608 to communicate with the electrical measurement device 306 and the camera 304. It should further be recognized that the testing system 308 may include additional interfaces and modules to enable subdivision of the functions of the system, for example by splitting testing and analysis functions into separate devices. In such a case, additional processors 602 and memory 604 may be employed to prevent, e.g., analysis from interfering with measurements.

Having described preferred embodiments of a system and method for integrated time-dependent dielectric breakdown reliability testing (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system for reliability testing, comprising:
an electrical measurement device configured to measure a leakage current of a device under test (DUT);
a camera configured to measure an optical characteristic of the DUT during a defect occurrence indicated by the measured leakage current; and
a test system configured to apply a stress to the DUT and to correlate the leakage current with the optical characteristic using a processor to determine a time and location of a defect occurrence within the DUT.

2. The system of claim 1, wherein the test system is configured to convolve a vector formed from electrical measurements with a vector formed from optical measurements.

3. The system of claim 2, the test system is configured to calculate a maximum value of the convolution as $$\text{Corr} = \max\left(\sum_j E(j)I(k+1-j)\right),$$

where k=1, . . . , m+n−1, m is a number of electrical measurements, n is a number of optical measurements, E is the optical measurement vector, and I is the electrical measurement vector.

4. The system of claim 1, wherein the defect is a time dependent dielectric breakdown.

5. The system of claim 1, wherein the stress is a stress voltage applied across the DUT.

6. The system of claim 5, wherein the applied stress voltage increases linearly with time.

7. The system of claim 1, wherein the optical characteristic is an optical measurement of emissions from the DUT over a specified period of time.

8. The system of claim 1, wherein the test system is further configured to adjust parameters of said stress, said leakage current measurement, or said optical measurement, based on the correlation.

9. The system of claim 1, wherein the test system is further configured to halt said stress, leakage current measurement, and optical measurement, based on the correlation.

10. The system of claim 1, wherein the electrical measurement device is further configured to periodically repeat the leakage current measurement.

11. The system of claim 1, wherein the test system is further configured to locate instances of increased noise in the leakage current measurement that correspond in time with instances of increased emissions in the optical measurement.

12. The system of claim 1, wherein the test system is further configured to segment an image of the DUT and determine a maximum emission intensity for each segment to localize emissions.

13. A system for reliability testing, comprising:
an electrical measurement device configured to measure an electrical characteristic of a device under test (DUT);
a camera configured to measure an optical characteristic of the DUT based on the timing of the measurement of the electrical characteristic;
a test system configured to apply a stress to the DUT, to locate instances of increased noise in the electrical measurement that correspond in time with instances of increased emissions in the optical measurement, and to correlate the electrical characteristic with the optical characteristic using a processor to determine a time and location of a defect occurrence within the DUT; and
wherein the test system is further configured to adjust parameters of said stress, said electrical measurement, or said optical measurement, based on the correlation.

14. The system of claim 13, wherein the test system is configured to convolve a vector formed from electrical measurements with a vector formed from optical measurements.

15. The system of claim 14, the test system is configured to calculate a maximum value of the convolution as $$\mathrm{Corr} = \max\left(\sum_j E(j)I(k+1-j)\right),$$

where k=1, ..., m+n−1, m is a number of electrical measurements, n is a number of optical measurements, E is the optical measurement vector, and I is the electrical measurement vector.

16. The system of claim 13, wherein the test system is further configured to halt said stress, electrical measurement, and optical measurement, based on the correlation.

17. The system of claim 13, wherein electrical measurement device is further configured to periodically repeat the electrical measurement.

18. The system of claim 13, wherein the test system is further configured to segment an image of the DUT and determine a maximum emission intensity for each segment to localize emissions.

19. A system for reliability testing, comprising:
an electrical measurement device configured to measure an electrical characteristic of a device under test (DUT);
a camera configured to measure an optical characteristic of the DUT during a defect occurrence indicated by the measured electrical characteristic; and
a test system configured to apply a stress to the DUT and to correlate the electrical characteristic with the optical characteristic using a processor to determine a time and location of a defect occurrence within the DUT, wherein the test system is further configured to halt said stress, electrical measurement, and optical measurement, based on the correlation.

* * * * *